(12) United States Patent
Yin et al.

(10) Patent No.: US 9,082,849 B2
(45) Date of Patent: Jul. 14, 2015

(54) SEMICONDUCTOR STRUCTURE AND METHOD FOR MANUFACTURING THE SAME

(75) Inventors: Haizhou Yin, Poughkeepsie, NY (US); Huilong Zhu, Poughkeepsie, NY (US); Zhijiong Luo, Poughkeepsie, NY (US)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 323 days.

(21) Appl. No.: 13/580,966

(22) PCT Filed: May 14, 2012

(86) PCT No.: PCT/CN2012/000650
§ 371 (c)(1),
(2), (4) Date: Aug. 24, 2012

(87) PCT Pub. No.: WO2013/044582
PCT Pub. Date: Apr. 4, 2013

(65) Prior Publication Data
US 2013/0082354 A1    Apr. 4, 2013

(51) Int. Cl.
*H01L 29/78* (2006.01)
*H01L 21/84* (2006.01)
*H01L 21/762* (2006.01)
*H01L 21/8234* (2006.01)
*H01L 29/66* (2006.01)

(52) U.S. Cl.
CPC .......... *H01L 29/785* (2013.01); *H01L 21/7624* (2013.01); *H01L 21/823431* (2013.01); *H01L 21/845* (2013.01); *H01L 29/66795* (2013.01)

(58) Field of Classification Search
CPC ............ H01L 21/845; H01L 21/02038; H01L 21/7624; H01L 21/76256; H01L 21/76264; H01L 21/823431; H01L 29/7851; H01L 29/785; H01L 21/0337; H01L 21/0338; H01L 21/3083; H01L 21/3086
See application file for complete search history.

(56) References Cited

U.S. PATENT DOCUMENTS 6,063,688 A *  5/2000  Doyle et al. ................... 438/424
8,729,609 B2 *  5/2014  Johnson et al. ............... 257/264
(Continued)

FOREIGN PATENT DOCUMENTS

CN           1691294 A    11/2005
CN           1846309 A    10/2006
(Continued)

*Primary Examiner* — Jose R Diaz
(74) *Attorney, Agent, or Firm* — Treasure IP Group, LLC (57) ABSTRACT

The present invention provides a method for manufacturing a semiconductor structure, comprising the steps of: providing a semiconductor substrate, forming an insulating layer on the semiconductor substrate, and forming a semiconductor base layer on the insulating layer; forming a sacrificial layer and a spacer surrounding the sacrificial layer on the semiconductor base layer, and etching the semiconductor base layer by taking the spacer as a mask to form a semiconductor body; forming a dielectric film on sidewalls of the semiconductor body; removing the sacrificial layer and the semiconductor body located under the sacrificial layer to form a first semiconductor fin and a second semiconductor fin; and forming a retrograde doped well structure on the inner walls of the first semiconductor fin and the second semiconductor fin, wherein the inner walls thereof are opposite to each other. Correspondingly, the present invention further provides a semiconductor structure. In the present invention, a retrograde doped well structure is formed on the sidewalls of the two semiconductor fins that are opposite to each other, so that the width of the source/drain depletion layer may be effectively reduced, and thereby the short channel effect is reduced.

11 Claims, 5 Drawing Sheets

(56) References Cited

U.S. PATENT DOCUMENTS

2012/0235247 A1* 9/2012 Cai et al. .................... 257/392
2013/0115777 A1* 5/2013 Tung et al. .................. 438/703

FOREIGN PATENT DOCUMENTS

| CN | 101068029 A | 11/2007 |
|---|---|---|
| CN | 101079450 A | 11/2007 |

* cited by examiner

SEMICONDUCTOR STRUCTURE AND METHOD FOR MANUFACTURING THE SAME

CROSS REFERENCE

This application is a National Phase application of, and claims priority to, PCT Application No. PCT/CN2012/000650, filed on May 14, 2012, entitled 'SEMICONDUCTOR STRUCTURE AND METHOD FOR MANUFACTURING THE SAME', which claimed priority to Chinese Application No. CN 201110300840.6, filed on Sep. 30, 2011. Both the PCT Application and Chinese Application are incorporated herein by reference in their entireties.

FIELD OF THE INVENTION

The present invention relates to the semiconductor technical field, more particularly, to a semiconductor structure and a method for manufacturing the same.

BACKGROUND OF THE INVENTION

In the semiconductor technology, the focus of research is shifted to a three dimensional (3D) device structure, in order to realize a full-depletion device. A 3D structure is constructed by forming a semiconductor fin (for forming a channel) on a semiconductor on insulator (SOI), forming a channel region at the middle of the semiconductor fin, forming a gate on the sidewalls of the semiconductor fin, and forming source/drain regions at both ends of the semiconductor fin.

Currently, dual fin structures appear in the 3D device structure, namely, two parallel semiconductor fins are formed on the SOI, and the two parallel semiconductor fins are taken as fin channels to form two independent semiconductor devices, wherein respective gates are formed on the sidewalls of the two semiconductor fins that are far away from each other, while the sidewalls of the two semiconductor fins that are opposite to each other are exposed. Thus, it is desirable to perform a processing to the exposed sidewalls of the two semiconductor fins, to thereby enhance the performance of the semiconductor device.

SUMMARY OF THE INVENTION

There is provided in the present invention a semiconductor structure and a method for manufacturing the same, wherein a retrograde doped well structure is formed on inner walls of the two semiconductor fins that are opposite to each other, so that the width of the source/drain depletion layer may be effectively reduced, and thereby the short channel effect is reduced.

In accordance with a first aspect of the present invention, there is provided a method for manufacturing a semiconductor structure, comprising:
a) providing a semiconductor substrate, forming an insulating layer on the semiconductor substrate, and forming a semiconductor base layer on the insulating layer;
b) forming a sacrificial layer and a spacer surrounding the sacrificial layer on the semiconductor base layer, and etching the semiconductor base layer by taking the spacer as a mask to form a semiconductor body;
c) forming a dielectric film on sidewalls of the semiconductor body;
d) removing the sacrificial layer and the semiconductor body located under the sacrificial layer to form a first semiconductor fin and a second semiconductor fin;
e) forming a retrograde doped well structure on the inner walls of the first semiconductor fin and the second semiconductor fin, wherein the inner walls thereof are opposite to each other.

In accordance with another aspect of the present invention, there is further provided a semiconductor structure, comprising a substrate, an insulating layer on the substrate, and semiconductor fins on the insulating layer,
the semiconductor fins including a first semiconductor fin and a second semiconductor fin that are parallel to each other;
a dielectric film is formed on the outer walls of the first semiconductor fin and the second semiconductor fin, the outer walls thereof being far away from each other; and
a retrograde doped well structure is formed on the inner walls of the first semiconductor fin and the second semiconductor fin, the inner walls thereof being opposite to each other.

The present invention has the following advantages over the prior art: as for a semiconductor structure having dual fins, a retrograde doped well structure is formed on inner walls of the two semiconductor fins that are opposite to each other, so that the width of the source/drain depletion layer is effectively reduced, thereby the short channel effect is reduced, and the semiconductor performance is enhanced.

BRIEF DESCRIPTION OF THE DRAWINGS

Other features, purposes and advantages of the present invention will become more apparent by reading the detailed descriptions of the non-limiting embodiments made with reference to the drawings below, wherein.

Wherein identical or similar reference signs indicate identical or similar components in the drawings.

DETAILED DESCRIPTION OF THE EMBODIMENTS

In order to make the objects, technical solutions and advantages of the present invention to be clearer, the embodiments of the present invention will be described in detail with reference to the drawings below.

The embodiments of the present invention are described in detail below, and the examples of the embodiments are provided in the drawings, wherein identical or similar reference signs indicate identical or similar components or components having identical or similar functions throughout the drawings. The embodiments described below with reference to the drawings are illustrative, which are used to explain the present invention, but can not be construed as limit of the present invention.

The disclosure herein provides many different embodiments or examples for realizing different structures of the present invention. In order to simplify the disclosure of the present invention, components and settings of specific examples are described below. Of course, they are only examples and are not intended to limit the present invention. Furthermore, reference numbers and/or letters may be repeated in different examples of the present invention. Such repetitions are for simplification and clearness, which per se do not indicate the relations of the discussed embodiments and/or settings. Moreover, the present invention provides examples of various specific processes and materials, but the applicability of other processes and/or application of other materials may be appreciated by those having ordinary skill in the art. Besides, the following described structure where a first feature is "on" a second feature may either comprise the embodiment where the first feature and the second feature are directly contacted, or may comprise the embodiment where additional features are formed between the first feature and the second feature, and thus the first feature and the second feature may not be directly contacted. The mutual relationships of various structures described in the invention include certain extensions made in accordance with requirements of the process or manufacturing procedure, e.g., the term "vertical" means the difference between an angle between two planes and 90° is within a tolerance allowed by the process or manufacturing procedure.

Figure 1:
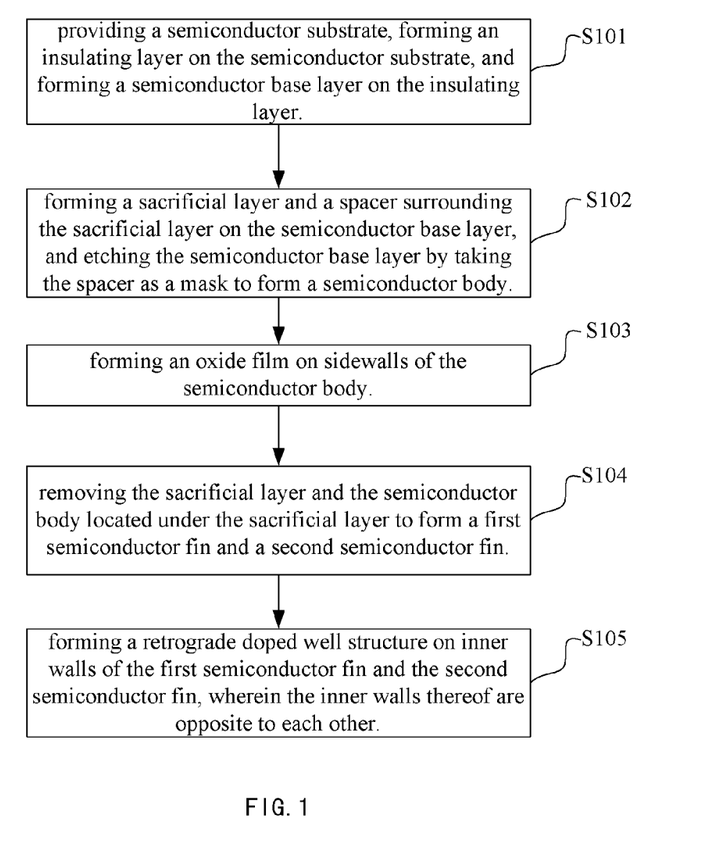
FIG. 1 is a flow chart showing a method for manufacturing the semiconductor structure in accordance with the present invention.

In accordance with a first aspect of the present invention, there is provided a method for manufacturing a semiconductor structure, as shown in FIG. 1. The method for manufacturing the semiconductor structure as shown in FIG. 1 is described in detail below with reference to FIGS. 2-10, wherein FIGS. 2-10 are diagrammatic cross-sections of the stages of the method for manufacturing the semiconductor structure as shown in FIG. 1 in accordance with an embodiment of the present invention.

First, in step S101, a semiconductor substrate 100 is provided, an insulating layer 101 is formed on the semiconductor substrate 100, and a semiconductor base layer 102 is formed on the insulating layer 101.

Figure 2:
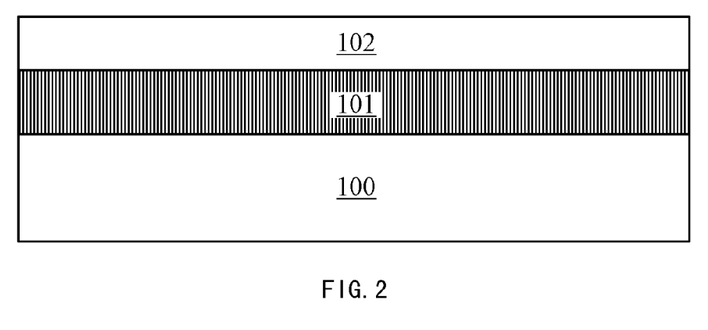
FIGS. 2-9 are diagrammatic cross-sections of the stages for manufacturing the semiconductor structure according to the flow chart shown in FIG. 1 in accordance with a preferred embodiment of the present invention.

Specifically, as shown in FIG. 2, the semiconductor substrate 100 is provided, on which an insulating material and a semiconductor material are sequentially deposited to form the insulating layer 101 and the semiconductor base layer 102. Wherein, in this embodiment, the semiconductor substrate 100 is formed of monocrystalline silicon. While in other embodiments, the semiconductor 100 may further comprise other elemental semiconductors such as germanium (Ge). Or, the semiconductor substrate 100 may further comprise compound semiconductors selected from a group consisting of silicon carbide, gallium arsenide, indium arsenide, and indium phosphide. Typically, the semiconductor substrate 100 may have a thickness of about but not limited to hundreds of micrometers, e.g., a thickness ranging between about 0.5 mm and about 1.5 mm.

The insulating layer 101 is formed of silicon dioxide, silicon oxide, or any other appropriate insulating materials. Typically, the insulating layer 101 may have a thickness ranging between about 200 nm and about 300 nm.

The material for the semiconductor base layer 102 is any one of the semiconductors comprised in the semiconductor substrate 100. In this embodiment, the semiconductor base layer 102 is formed of monocrystalline silicon. While in other embodiments, the semiconductor base layer 102 may further comprise other elemental semiconductors or other compound semiconductors. Wherein the semiconductor base layer 102 has a thickness ranging between about 50 nm and about 100 nm. Preferably, the semiconductor base layer 102 may have a thickness consistent with the height of the semiconductor fins to be formed subsequently.

Then, step S102 is performed, a sacrificial layer 200 and a spacer 201 surrounding the sacrificial layer 200 are formed on the semiconductor base layer 102, and the semiconductor base layer 102 is etched by taking the spacer 201 as a mask to form a semiconductor body 103.

Figure 3:
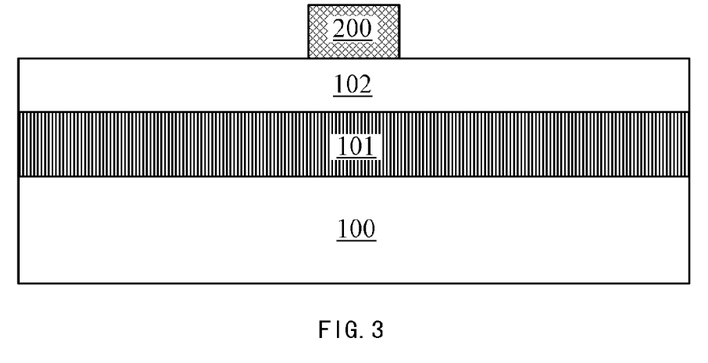

Specifically, as shown in FIG. 3, first a sacrificial layer 200 is formed on the semiconductor base layer 102, on which the area covered by the sacrificial layer 200 will be used to define the distance between the two semiconductor fins to be formed. Wherein, the sacrificial layer 200 is formed of a material selected from a group consisting of silicon oxide, silicon nitride and other appropriate materials, with a thickness ranging between about 30 nm and about 80 nm. The method for forming the sacrificial layer is common knowledge known by those having ordinary skill in the art, and no more unnecessary details will be provided here.

Figure 4:
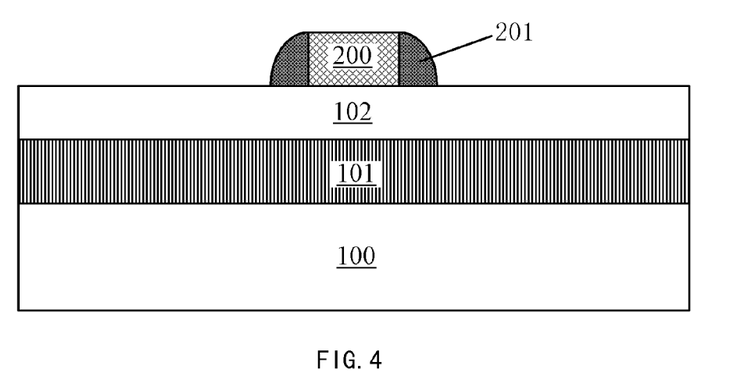

Next, as shown in FIG. 4, a spacer 201 surrounding the sacrificial layer 200 is formed. The material for the spacer 201 may be one of silicon nitride, silicon oxide, silicon oxynitride, and silicon carbide or any combinations thereof. The spacer 201 may have a multi-layer structure and may be formed by a deposition-etching process, with a thickness ranging between about 5 nm and about 40 nm, e.g., 10 nm, 20 nm or 35 nm. Wherein the thickness of the spacer 201 is just equal to the thickness of the semiconductor fins to be formed subsequently.

Figure 5:
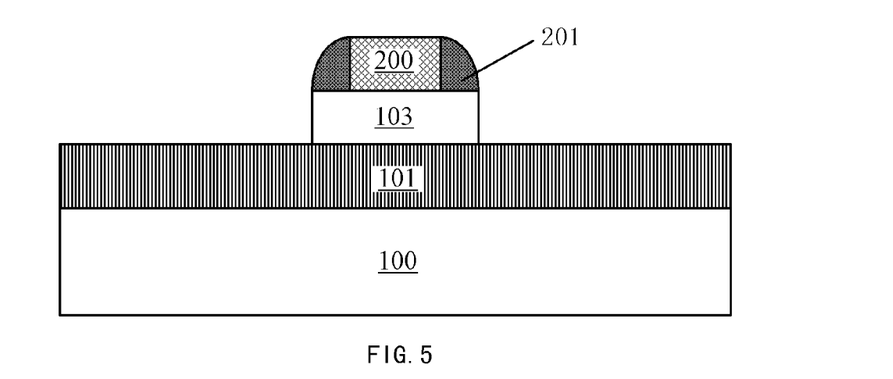

Thereafter, as shown in FIG. 5, the semiconductor base layer 102 is etched by taking the spacer 201 as a mask to form a semiconductor body 103 under the spacer 201 and the sacrificial layer. Wherein appropriate processes such as dry etching and/or wet etching may be used to etch the semiconductor base layer 102.

In step S103, an oxide film 300 is formed on the sidewalls of the semiconductor body 103.

Figure 6:
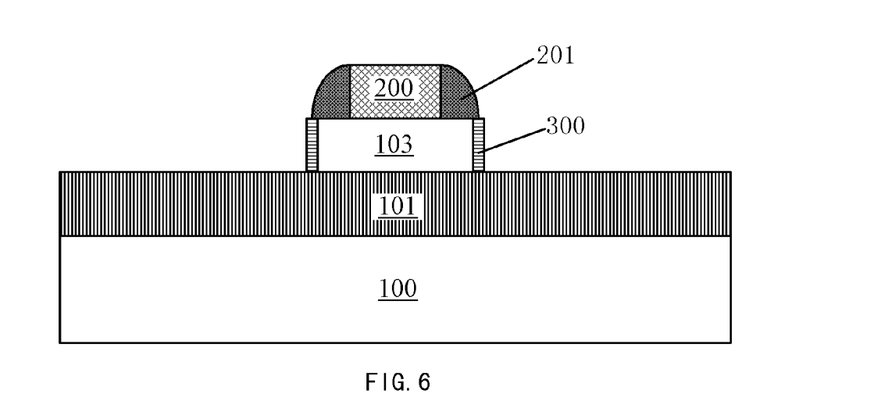

Specifically, as shown in FIG. 6, an oxide film 300 is formed on the sidewalls of the semiconductor body 103 under the spacer 201 by thermal oxidation upon formation of the semiconductor body 103, the oxide film 300 has a thickness ranging between about 7 nm and about 10 nm. Furthermore, the method for forming the oxide film 300 is not limited to the thermal oxidation, other oxidation methods such as plasma oxidation or high temperature perchloric acid solution may also be adopted. In this embodiment, if the material for the semiconductor body 103 is monocrystalline silicon, then the oxide film 300 is silicon dioxide. As for other embodiments of the present invention, other different insulating films such as a nitride film, an oxynitride film or any other dielectric films that can achieve an insulating function may also be formed.

And then, step S104 is performed to remove the sacrificial layer 200 and the semiconductor body 103 under the sacrificial layer 200, so as to form a first semiconductor fin 210 and a second semiconductor fin 220.

Figure 7:
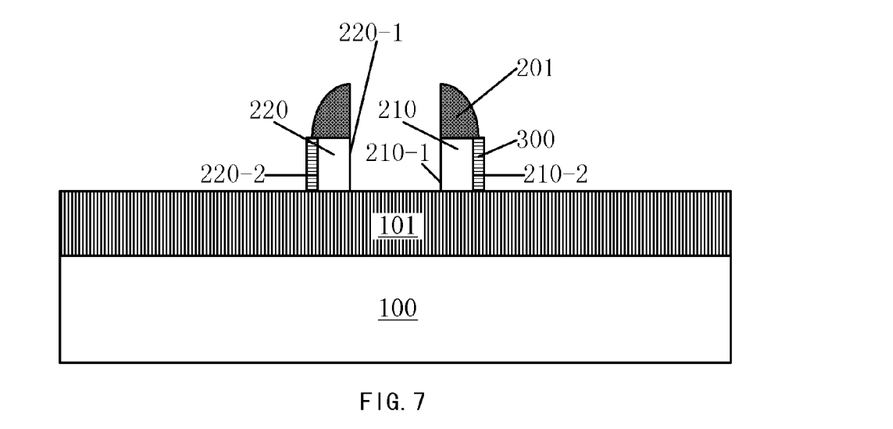
Figure 8:
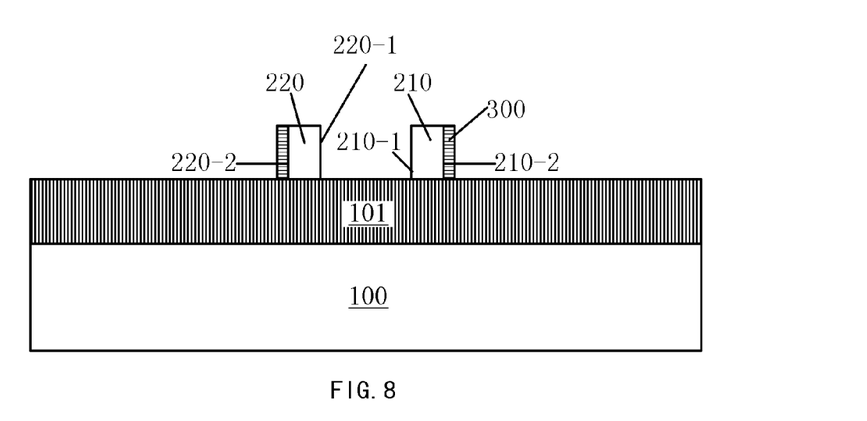

As shown in FIG. 7, first, the sacrificial layer 200 is selectively etched to expose the semiconductor body 103, then the exposed area of the semiconductor body 103 is etched by taking the spacer 201 as a mask and taking the insulating layer 101 as an etching stop layer, to expose the insulating layer 101. Wherein appropriate processes such as dry etching and/or wet etching may be used, and no more unnecessary details will be provided here. After etching, semiconductor fins comprising a first semiconductor fin 210 and a semiconductor fin 220 that are parallel to each other are formed under the spacer 201, each of the fins comprises two sidewalls, that is, the sidewall 210-1 and sidewall 210-2 of the first semiconductor fin 210, and the sidewall 220-1 and sidewall 220-2 of the second semiconductor fin 220, wherein the sidewall 210-1 of the first semiconductor fin and the sidewall 220-1 of the second semiconductor fin are respectively located at the inner side of the first semiconductor fin 210 and the second semiconductor fin 220 and are opposite to each other, while the sidewall 210-2 of the first semiconductor fin and the sidewall 220-2 of the second semiconductor fin are respectively located at the outer side of the first semiconductor fin 210 and the second semiconductor fin 220 and are far away from each other. The first semiconductor fin 210 and/or the second semiconductor fin 220 have a thickness ranging between about 5 nm and about 40 nm and have a height ranging between about 50 nm and about 100 nm. Taking the first semiconductor fin 210 as an example, the thickness refers to the distance between the sidewall 210-1 and the sidewall 210-2 of the first semiconductor fin, and the height refers to the distance between the upper surface of the first semiconductor fin and the insulating layer. Upon formation of the semiconductor fins, the spacer 201 is selectively removed, as shown in FIG. 8. Alternatively, the spacer 201 may also be removed after forming a retrograde doped well structure subsequently.

Finally, in step S105, a retrograde doped well structure is formed on the inner walls of the first semiconductor fin 210 and the second semiconductor fin 220, wherein the inner walls thereof are opposite to each other.

Figure 9:
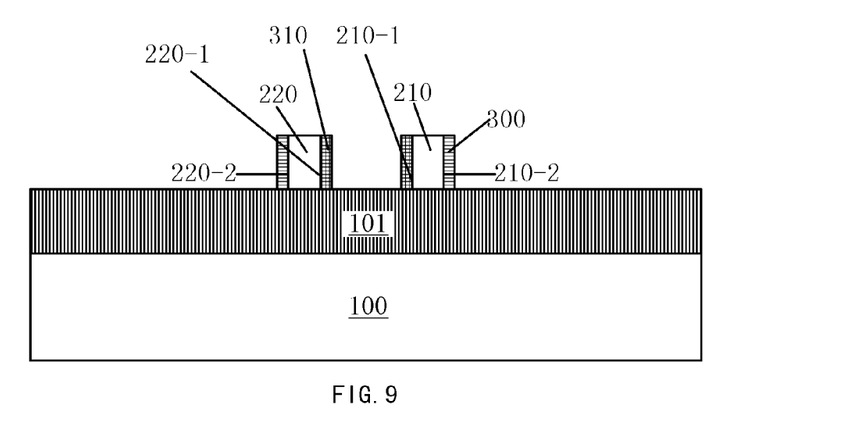
Figure 10:
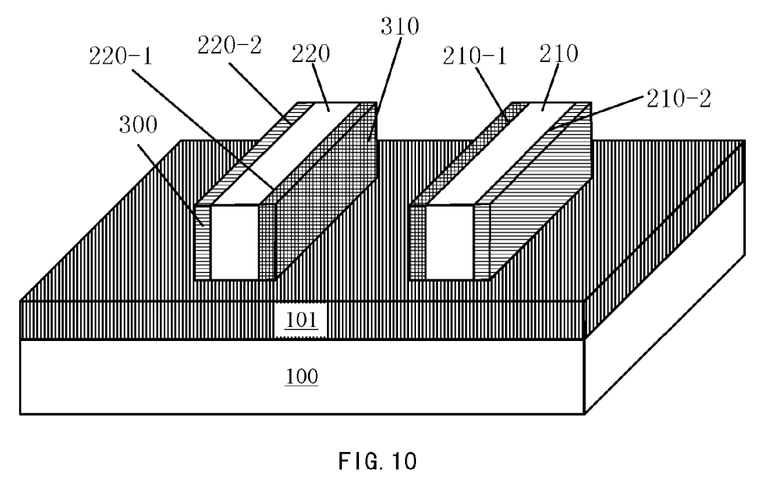
FIG. 10 is a pictorial drawing of the semiconductor structure as shown in FIG. 9.

Specifically, as shown in FIGS. 9 and 10, (FIG. 10 is provided for clarity, FIG. 10 is a pictorial drawing of the semiconductor structure as shown in FIG. 9), an epitaxial layer 310 is formed on the surface of the sidewall 210-1 of the first semiconductor fin 210 and the sidewall 220-1 of the second semiconductor fin 220 that are opposite to each other, the thickness thereof ranges between about 10 nm and about 20 nm. In-situ doping is performed simultaneously during the epitaxial growth process, wherein the in-situ doping concentration shall be higher than the doping concentration of the first semiconductor fin 210 and the second semiconductor fin 220, to thereby form a super-steep retrograde doped well structure. In this embodiment, the in-situ doping concentration is $5\times10^{18}$ to $5\times10^{19}$ $cm^{-3}$. As for an NMOS device, the doping for the epitaxial layer 310 is of a P type; as for a PMOS device, the doping for the epitaxial layer 310 is of an N type. The super-steep retrograde doped well structure is helpful to thin the depletion layer, to thereby reduce the short channel effect effectively. The selective epitaxial growth and in-situ doping are common techniques known by those having ordinary skill in the art, and no more unnecessary details will be provided here.

After performing the above steps, a semiconductor structure with dual fins is formed, and a retrograde doped well structure is formed on the inner walls of the two semiconductor fins that are opposite to each other, which structures may reduce the width of the source/drain depletion layer effectively, to thereby reduce the short channel effect, and enhance the semiconductor performance.

In accordance with another aspect of the present invention, there is further provided a semiconductor structure. As shown in FIGS. 9 and 10, the semiconductor structure comprises a substrate 100, an insulating layer 101 on the substrate 100, and semiconductor fins on the insulating layer. Wherein the semiconductor fins comprise a first semiconductor fin 210 and a semiconductor fin 220 that are parallel to each other, and a dielectric film 300 is formed on the sidewalls of the first semiconductor fin 210 and the second semiconductor fin 220 that are far away from each other; and a retrograde doped well structure is formed on the inner walls of the first semiconductor fin 210 and the second semiconductor fin 220, wherein the inner walls thereof are opposite to each other.

The "parallel" means substantially parallel within a tolerance achieved in the semiconductor manufacturing field.

Specifically, in this embodiment, the semiconductor substrate 100 is monocrystalline silicon. While in other embodiments, the semiconductor 100 may further comprise other elemental semiconductors such as germanium (Ge). Or, the semiconductor substrate 100 may further comprise compound semiconductors selected from a group consisting of silicon carbide, gallium arsenide, indium arsenide, and indium phosphide. Typically, the semiconductor substrate 100 may have a thickness of about but not limited to hundreds of micrometers, e.g., a thickness ranging between about 0.5 mm and about 1.5 mm.

The insulating layer 101 is formed of silicon dioxide, silicon oxide, or any other appropriate insulating materials. Typically, the insulating layer 101 may have a thickness ranging between about 200 nm and about 300 nm.

The material for the first semiconductor fin 210 and the second semiconductor fin 220 is any one of the semiconductors comprised in the semiconductor substrate 100. In this embodiment, the first semiconductor fin 210 and the second semiconductor fin 220 are formed of monocrystalline silicon. In other embodiments, the first semiconductor fin 210 and the second semiconductor fin 220 may further comprise other elemental semiconductors or compound semiconductors. Wherein, each fin has two sidewalls, that is, the sidewall 210-1 and sidewall 210-2 of the first semiconductor fin 210, and the sidewall 220-1 and sidewall 220-2 of the second semiconductor fin 220, wherein the sidewall 210-1 of the first semiconductor fin and the sidewall 220-1 of the second semiconductor fin are respectively located at the inner side of the first semiconductor fin 210 and the second semiconductor fin 220 and are opposite to each other, while the sidewall 210-2 of the first semiconductor fin and the sidewall 220-2 of the second semiconductor fin are respectively located at the outer side of the first semiconductor fin 210 and the second semiconductor fin 220 and are far away from each other. The first semiconductor fin 210 and the second semiconductor fin 220 have a thickness ranging between about 5 nm and about 40 nm and have a height ranging between about 50 nm and about 100 nm. Taking the first semiconductor fin 210 as an example, the thickness refers to the distance between the sidewall 210-1 and the sidewall 210-2 of the first semiconductor fin, and the height refers to the distance between the upper surface of the first semiconductor fin 210 and the insulating layer.

A dielectric film 300 is formed on the sidewall 210-2 of the first semiconductor fin 210 and the sidewall 220-2 of the second semiconductor fin 220 that are far away from each other, the thickness thereof ranges between about 7 nm and about 10 nm. In this embodiment, if the material for the first semiconductor fin 210 and the second semiconductor fin 220 is monocrystalline silicon, then the oxide film 300 is silicon dioxide. In other embodiments of the present invention, the dielectric film 300 may also be other different insulating films such as a nitride film, an oxynitride film or any other dielectric films that can achieve an insulating function.

An epitaxial layer 310 is formed on the sidewall 210-1 of the first semiconductor fin 210 and the sidewall 220-1 of the second semiconductor fin 220 that are opposite to each other, the doping concentration thereof shall be higher than that of the first semiconductor fin 210 and the second semiconductor fin 220, to thereby form a super-steep retrograde doped well structure. In this embodiment, the doping concentration for the epitaxial layer 310 is $5\times10^{18}$ to $5\times10^{19}$ $cm^{-3}$. As for an NMOS device, the doping for the epitaxial layer 310 is of a P type; as for a PMOS device, the doping for the epitaxial layer 310 is of an N type.

The semiconductor structure provided by the present invention is dual fin structures, wherein a retrograde doped well structure is formed on the inner walls of the two semiconductor fins that are opposite to each other, which structures may reduce the width of the source/drain depletion layer effectively, to thereby reduce the short channel effect, and enhance the semiconductor performance.

Although the illustrative embodiments and their advantages have been described in detail, it shall be appreciated that various changes, substitutions and modifications can be made to these embodiments without departing from the spirit of the invention and the scope defined by the attached claims. As for other examples, it may be appreciated by those having ordinary skill in the art that the sequence of the process steps may be changed while keeping the protection scope of the present invention.

In addition, the present invention is applied to a scope that shall not be limited by the processes, mechanisms, manufacture, material constitutions, measures, methods and steps described in the specific embodiments of the Specification. From the disclosure of the present invention, it may be appreciated by those having ordinary skill in the art that for the processes, mechanisms, manufacture, material constitutions, measures, methods or steps currently existed or will be developed, where they perform substantially the same functions or achieve substantially the same effects as the corresponding embodiments of the present invention, they can be applied in accordance with the present invention. Therefore, the appended claims of the present invention aim to comprise these processes, mechanisms, manufacture, material constitutions, measures, methods or steps within their protection scopes.

What is claimed is:

1. A method for manufacturing a semiconductor structure, comprising:
    a) providing a semiconductor substrate (100), forming an insulating layer (101) on the semiconductor substrate (100), and forming a semiconductor base layer (102) on the insulating layer (101);
    b) forming a sacrificial layer (200) and a spacer (201) surrounding the sacrificial layer (200) on the semiconductor base layer (102), and etching the semiconductor base layer (102) by taking the spacer (201) as a mask to form a semiconductor body (103);
    c) forming a dielectric film (300) on sidewalls of the semiconductor body (103);
    d) removing the sacrificial layer (200) and the semiconductor body (103) located under the sacrificial layer (200) to form a first semiconductor fin (210) and a second semiconductor fin (220); and
    e) forming a retrograde doped well structure on inner walls of the first semiconductor fin (210) and the second semiconductor fin (220), wherein the inner walls thereof are opposite to each other.

2. The method for manufacturing a semiconductor structure according to claim 1, wherein the step e) comprises:
    growing an epitaxial layer (310) selectively on the inner walls of the first semiconductor fin (210) and the second semiconductor fin (220) that are opposite to each other, wherein the doping concentration of the epitaxial layer (310) is higher than that of the first semiconductor fin (210) and the second semiconductor fin (220).

3. The method for manufacturing a semiconductor structure according to claim 2, wherein
    the doping concentration of the epitaxial layer (310) ranges between about $5\times10^{18}$ and about $5\times10^{19}$ cm$^{-3}$.

4. The method for manufacturing a semiconductor structure according to claim 2, wherein
    the epitaxial layer (310) has a thickness ranging between about 10 nm and about 20 nm.

5. The method for manufacturing a semiconductor structure according to claim 2, wherein the step c) comprise:
    performing a thermal oxidation operation to the semiconductor body (103) to form an oxide film as the dielectric film (300).

6. The method for manufacturing a semiconductor structure according to claim 2, wherein the step d) comprises:
    etching the sacrificial layer (200) by taking the spacer (201) as a mask; and
    etching the semiconductor body (103) by taking the spacer (201) as a mask and taking the insulating layer (101) as an etching stop layer, to form the first semiconductor fin (210) and the second semiconductor fin (220) under the spacer (201).

7. The method for manufacturing a semiconductor structure according to claim 1, wherein the step c) comprise:
    performing a thermal oxidation operation to the semiconductor body (103) to form an oxide film as the dielectric film (300).

8. The manufacturing method according to claim 1, wherein the dielectric film (300) has a thickness ranging between about 7 nm and about 10 nm.

9. The method for manufacturing a semiconductor structure according to claim 1, wherein the step d) comprises:
    etching the sacrificial layer (200) by taking the spacer (201) as a mask; and
    etching the semiconductor body (103) by taking the spacer (201) as a mask and taking the insulating layer (101) as an etching stop layer, to form the first semiconductor fin (210) and the second semiconductor fin (220) under the spacer (201).

10. The method for manufacturing a semiconductor structure according to claim 9, wherein
    the first semiconductor fin (210) and/or the second semiconductor fin (220) have a thickness ranging between about 5 nm and about 40 nm; and
    the first semiconductor fin (210) and/or the second semiconductor fin (220) have a height ranging between about 50 nm and about 100 nm.

11. The method for manufacturing a semiconductor structure according to claim 1, wherein after step d), the method further comprises:
    f) removing the spacer (201).

* * * * *